(12) United States Patent
Lee et al.

(10) Patent No.: US 7,626,413 B2
(45) Date of Patent: Dec. 1, 2009

(54) PARALLEL TESTING OF SEMICONDUCTOR DEVICES USING A DIVIDING VOLTAGE SUPPLY UNIT

(75) Inventors: Sang-Hoon Lee, Gyeonggi-do (KR); Joon-Su Ji, Gyeonggi-do (KR); Jung-Bae Ahn, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/185,697

(22) Filed: Aug. 4, 2008

(65) Prior Publication Data
US 2008/0290891 A1    Nov. 27, 2008

Related U.S. Application Data

(62) Division of application No. 11/330,013, filed on Jan. 10, 2006, now Pat. No. 7,423,443.

(30) Foreign Application Priority Data

Jan. 11, 2005    (KR) ................... 2005-00002460

(51) Int. Cl.
*G01R 31/02* (2006.01)
(52) U.S. Cl. ..................................... 324/765
(58) Field of Classification Search .............. None
See application file for complete search history.

(56) References Cited

U.S. PATENT DOCUMENTS

| | | | |
|---|---|---|---|
| 5,070,297 A | 12/1991 | Kwon et al. | |
| 5,130,645 A | 7/1992 | Levy | |
| 5,146,161 A | 9/1992 | Kiser | |
| 5,736,850 A | 4/1998 | Legal | |
| 5,973,504 A | 10/1999 | Chong | |
| 6,204,679 B1 | 3/2001 | Gray, III | |
| 6,452,411 B1 * | 9/2002 | Miller et al. | ................. 324/765 |
| 6,480,978 B1 | 11/2002 | Roy et al. | |
| 6,499,121 B1 | 12/2002 | Roy et al. | |
| 6,657,455 B2 | 12/2003 | Eldridge et al. | |
| 7,227,351 B2 | 6/2007 | Kim et al. | |
| 2003/0115519 A1 | 6/2003 | Kwon et al. | |

(Continued)

FOREIGN PATENT DOCUMENTS

JP    10-221402    8/1998

(Continued)

OTHER PUBLICATIONS

English language abstract of Korean Publication No. 1997-0016609.

(Continued)

*Primary Examiner*—Vinh P Nguyen
(74) *Attorney, Agent, or Firm*—Volentine & Whitt, PLLC (57) ABSTRACT

Provided is a method of performing a parallel test on semiconductor devices, the method including coupling a power signal line to a set of at least two semiconductor devices through a switching device, performing at least one part of a parallel test on the set of semiconductor devices, and disconnecting a semiconductor device from the set in response to determining that the semiconductor device is defective as a result of the at least one part of the parallel test.

7 Claims, 8 Drawing Sheets

U.S. PATENT DOCUMENTS

2006/0015785 A1 1/2006 Chun
2008/0091979 A1* 4/2008 Okuda .................. 714/42

FOREIGN PATENT DOCUMENTS

| KR | 1997-0016609 | 4/1997 |
|---|---|---|
| KR | 1998-028731 | 7/1998 |
| KR | 2000-0041167 | 7/2000 |

OTHER PUBLICATIONS

English language abstract of Korean Publication No. 1998-028731.
English language abstract of Korean Publication No. 2000-0041167.
English language abstract of Japanese Publication No. 10-221402.

* cited by examiner

PARALLEL TESTING OF SEMICONDUCTOR DEVICES USING A DIVIDING VOLTAGE SUPPLY UNIT

CROSS-REFERENCE TO RELATED PATENT APPLICATION

This application is a Divisional of U.S. Ser. No. 11/330,013, filed on Jan. 10, 2006, now U.S. Pat. No. 7,423,443, which claims priority from Korean Patent Application No. 10-2005-0002460, filed on Jan. 11, 2005, all of which are hereby incorporated by reference in their entirety.

BACKGROUND OF THE INVENTION

1. Field of the Invention

This application relates to an apparatus for and method of testing semiconductor devices, and more particularly, to a method of increasing the number of semiconductors that can be tested at a time by improving the structure of a performance board of a testing apparatus and performing a parallel test on the doubled semiconductor devices.

2. Description of the Related Art

Semiconductor devices are produced in wafer forms and are assembled into a semiconductor package after an electrical die sorting (EDS) test. The semiconductor devices are finally tested electrically before being distributed to users. In particular, as the capacity of semiconductor memory devices and the number of semiconductor memory device pins increase rapidly, it becomes increasingly important to enhance efficiency of an electrical test process.

To enhance the efficiency of the electrical test, a tester for testing semiconductor memory devices has been developed, focusing on increasing speed and throughput, and shortening testing time of the tester. The testing time may be shortened using the following methods.

A first method is to change a testing method and modify a test program to shorten test time. A second method is to increase the number of semiconductor memory devices tested at a time, i.e., the number of devices under test (DUTs), in a parallel test.

Figure 1:
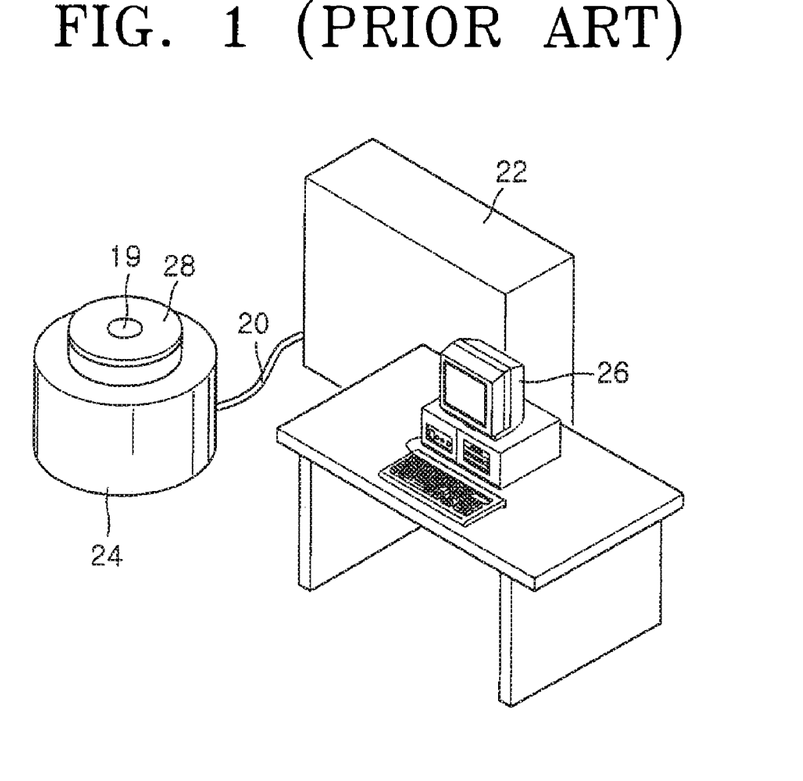
FIG. 1 is a perspective view of a conventional tester used to electrically test semiconductor devices.

FIG. 1 is a schematic perspective view of a conventional tester used to electrically test semiconductor devices. Referring to FIG. 1, a measuring unit needed to electrically test the semiconductor devices is included in a mainframe 22. The function of the mainframe 22 is extended to a test head 24 through a signal cable 20. A performance board 28 is mounted on top of the test head 24. The performance board 28 includes driver signal lines, I/O signal lines, power signal lines, and ground signal lines formed in a printed circuit pattern. Since a pogo pin block 19 is formed at the center of the performance board 28, the performance board 28 may be connected to a prober system or a handler and then used.

Figure 2:
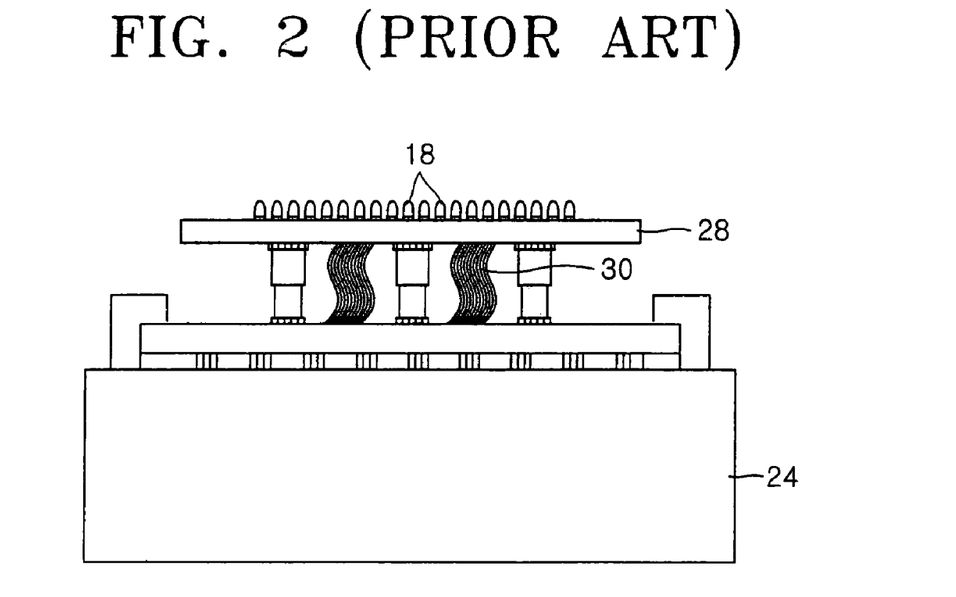
FIG. 2 is a sectional view of a test head and a performance board of FIG. 1.

FIG. 2 is a sectional view of the test head 24 and the performance board 28 of FIG. 1. Referring to FIG. 2, the test head 24 includes a driver channel, an I/O channel, and a voltage supply unit (VSU) channel. The driver channel, the I/O channel, and the VSU channel are connected to a printed circuit patterns (not shown) of the performance board 28 by signal lines 30. The printed circuit patterns in the performance board 28 are connected to pogo pins 18.

In the EDS test, the pogo pins 18 are connected to a probe card of the prober system. In the final electrical test of a semiconductor package, a DUT board is connected into the pogo pins 18.

Figure 3:
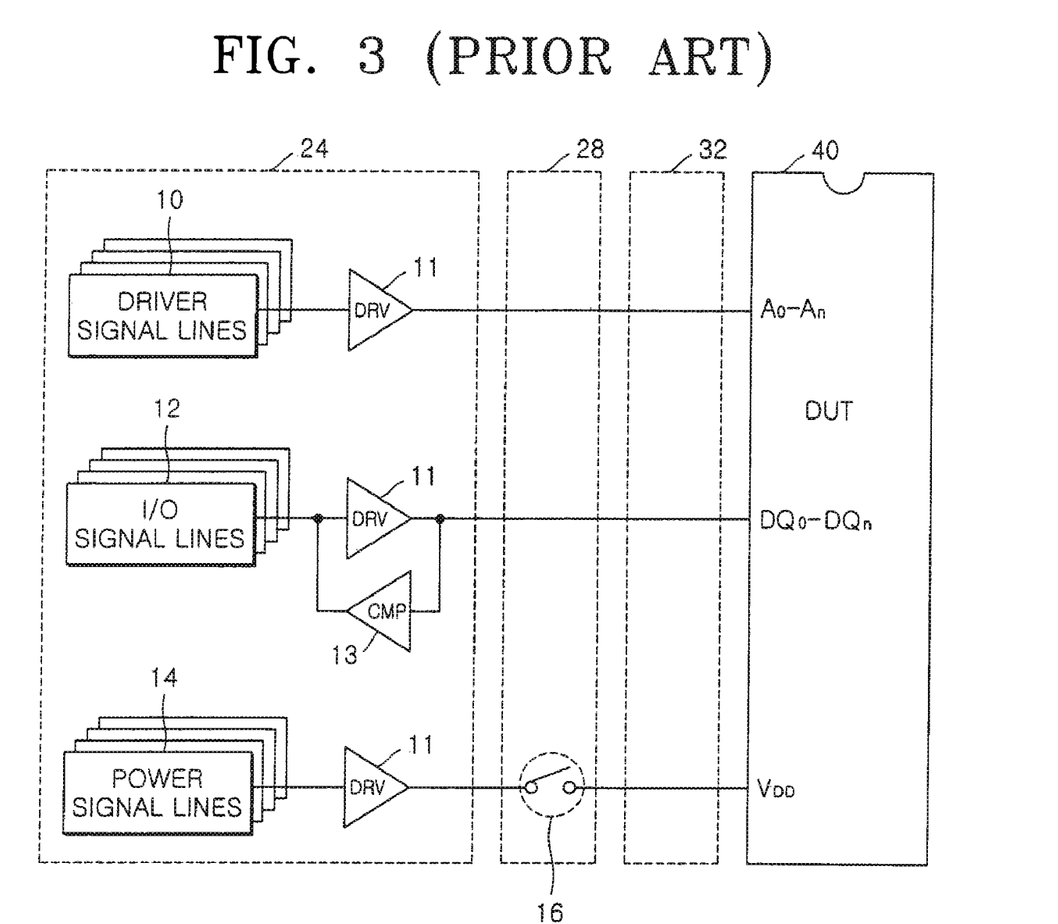
FIG. 3 is a block diagram illustrating signal lines connected from the test head to a plurality of DUTs.

FIG. 3 illustrates signal lines connected from the test head 24 to a plurality of DUTs 40. Referring to FIG. 3, the test head 24 includes a driver signal line 10, an I/O signal line 12, and a power signal line 14 of a VSU. The driver signal line 10 is connected to address pins A0 through An of the DUTs 40 by a driver 11, via the performance board 28 and an interface board 32. The interface board 32 may be the probe card or the DUT board.

The I/O signal lines 12 are connected to data pins DQ0 through DQn of the DUTs 40 by the driver 11 and a comparator 13, via the performance board 28 and the interface board 32. The power signal lines 14 are connected to power pins $V_{DD}$ of the DUTs 40 by the driver 11, via a relay 16 of the performance board 28 and the interface board 32.

If it is determined that a DUT is defective as a result of a parallel electrical test, the relay 16 is turned off, thereby preventing DUTs adjacent to the defective DUT or the interface board 32, such as the probe card, from being damaged.

Figure 4:
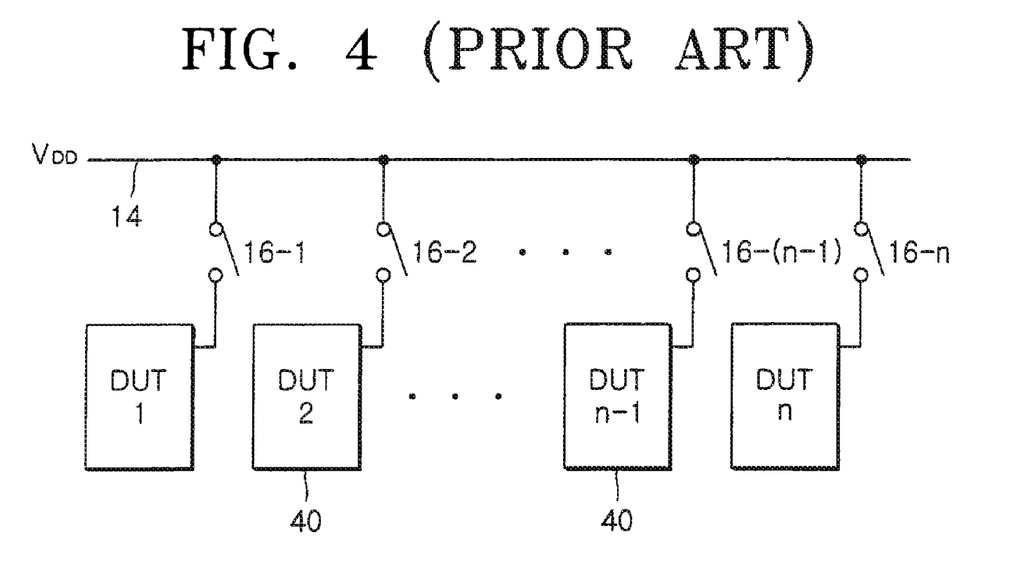
FIG. 4 is a block diagram illustrating a connection state of a power signal line in the performance board.

FIG. 4 is a block diagram for illustrating a connection state of the power signal line 14 in the performance board 28. Referring to FIG. 4, in the parallel test, the power signal line 14 in the printed circuit pattern of the performance board 28 is connected to the power pin $V_{DD}$ of each of the DUTs 40. In the parallel electrical test, all of first through $n^{th}$ relays 16-1 through 16-n are connected. However, if a second DUT is found defective in the parallel test, the second relay 16-2 is turned off, thereby preventing DUTs adjacent to the second DUT from being damaged or a needle of the interface board 32 of FIG. 3 from melting.

However, the method described above is a mechanism for testing a predetermined number of DUTs in a parallel electrical test process. To increase the number of DUTs, a new control method in terms of software and hardware is required.

SUMMARY

Embodiments include a method of performing a parallel test on semiconductor devices including coupling a power signal line to a set of at least two semiconductor devices through a switching device, performing at least one part of a parallel test on the set of semiconductor devices, and disconnecting a semiconductor device from the set in response to determining that the semiconductor device is defective as a result of the at least one part of the parallel test.

Further embodiments include an apparatus for testing semiconductor devices including a power signal line, switching devices, and connections for testing sets of semiconductor devices, each connection coupled to the power signal line through an associated switching device, and each such set of semiconductor devices including at least two semiconductor devices.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF THE INVENTION

Embodiments will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art.

For example, a tester, which will be described in the following embodiments, may be for testing semiconductor memory devices. Alternatively, the tester may be an LSI device tester, an analog tester, or a mixed signal tester. In addition, the structure of the tester may be slightly modified to accomodate a tester manufacturer.

Figure 5:
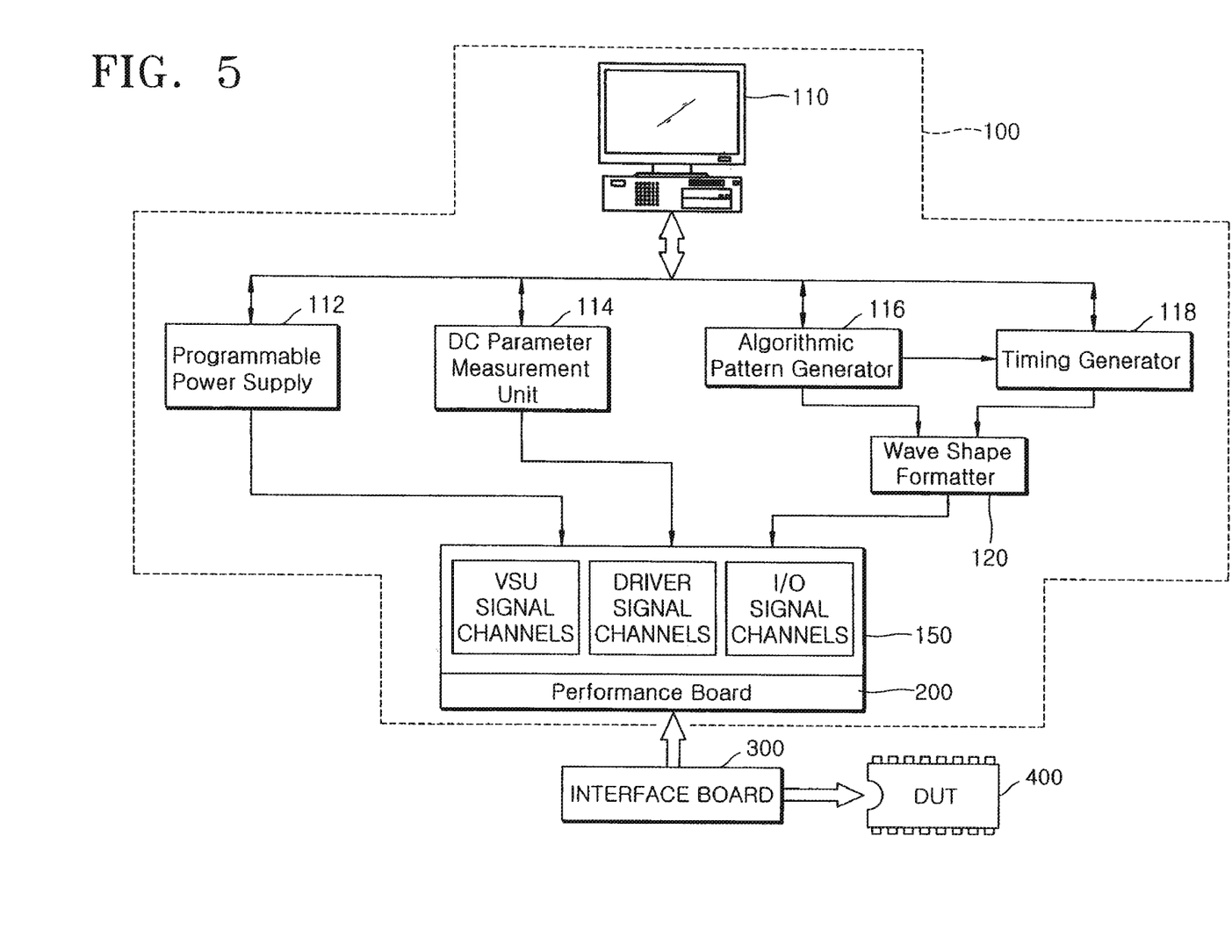
FIG. 5 is a block diagram of a tester used to electrically test semiconductor devices.

FIG. 5 is a block diagram of a tester 100 used to electrically test semiconductor devices. Referring to FIG. 5, the tester 100 includes a tester processor 110 in a workstation for controlling hardware components in the tester 100. The hardware components may include a programmable power supply 112, a DC parameter measurement unit 114, an algorithmic pattern generator 116, a timing generator 118, a wave shape formatter 120, and a pin test head 150.

The pin test head 150 includes a driver signal channel, an input/output (I/O) signal channel, and a power signal channel connected to a voltage supply unit (VSU). A performance board 200 is loaded onto the pin test head 150. Using a test program running on the tester processor 110, the tester 100 allows the hardware components in the tester 100 to communicate signals to and test electric functions of devices under test (DUTs) 400 connected to the tester 100 by an interface board 300.

The test program may consist of a DC test, an AC test, and a function test. The function test is to test functions of a semiconductor memory device under actual operating conditions. For example, an input pattern from the algorithmic pattern generator 116 of the tester 100 is written to the DUTs 400, and an output pattern from the DUTs 400, is read out and compared with an expected pattern using a comparator. A specific example of DUT 400 is a DRAM. The input pattern could simulate a write operation and the output pattern could simulate a read operation.

Figure 6:
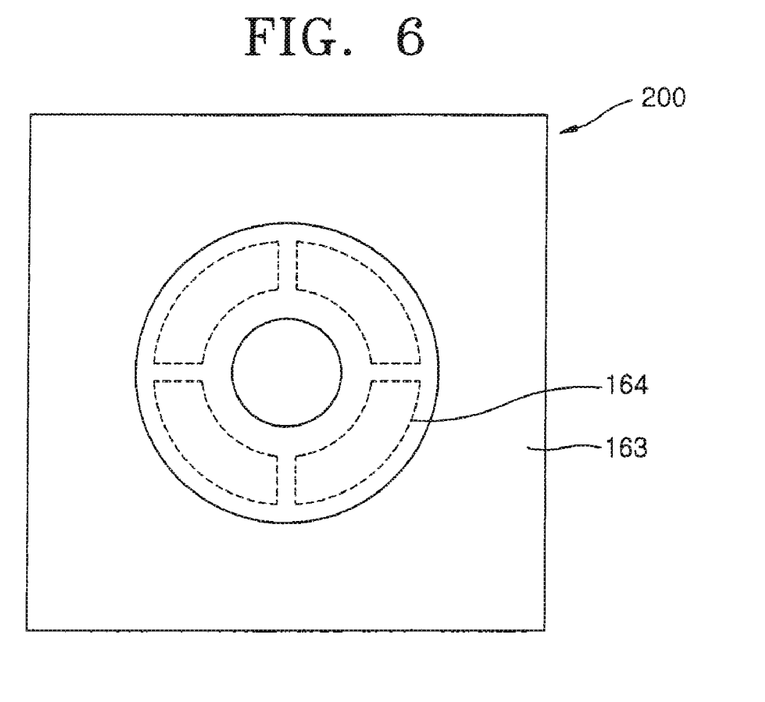
FIG. 6 is a top view of a performance board of FIG. 5.

FIG. 6 is a top view of the performance board 200 of FIG. 5. Referring to FIG. 6, the performance board 200 may be a printed circuit board (PCB) 163 in a multilayer substrate form. The performance board 200 includes printed circuit patterns used as a driver signal line, an I/O signal line, and a power signal line and a ground signal line connected to the VSU. A pogo pin block 164 is formed at the center of the performance board 200 such that the printed circuit patterns used as the driver signal line, the I/O signal line, and the power signal line and the ground signal line connected to the VSU are connected to the DUTs 400 by the interface board 300.

In an electrical die sorting (EDS) test conducted when semiconductor memory devices are in wafer forms, the interface board 300 is a probe card and a prober system is an automatic test robot. In a final electrical test conducted when the semiconductor memory devices are assembled into a semiconductor package, the interface board 300 is a DUT board and uses a handler as the automatic test robot.

Figure 7:
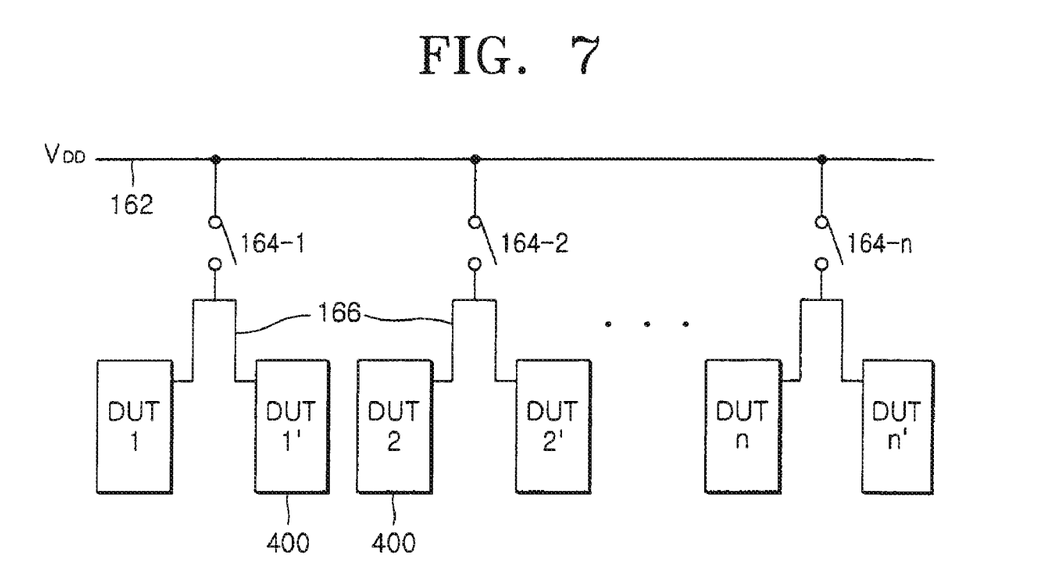
FIG. 7 illustrates power signal lines divided into two power signal lines in the performance board.

FIG. 7 illustrates a power signal line 162 divided into two power signal lines 166 in the performance board 200. Referring to FIG. 7, the power signal line 162 can be divided into two separate power signal lines 166. Accordingly, the number of DUTs 400 can be doubled in the parallel test. For example, if it is determined that one (DUT 1') of DUT 1 and DUT 1' is defective as a result of the parallel test, a relay 164-1 is not turned off. Thus, DUT 1 adjacent to DUT 1' or a needle of the interface board 300 may be damaged. For example, if the interface board 300 is a probe card, a needle of the probe card may melt. However, if it is determined that both of DUT 1 and DUT 1' are defective as a result of the parallel test, the tester 100 can turn off the relay 164-1 using its operating system.

Figure 8:
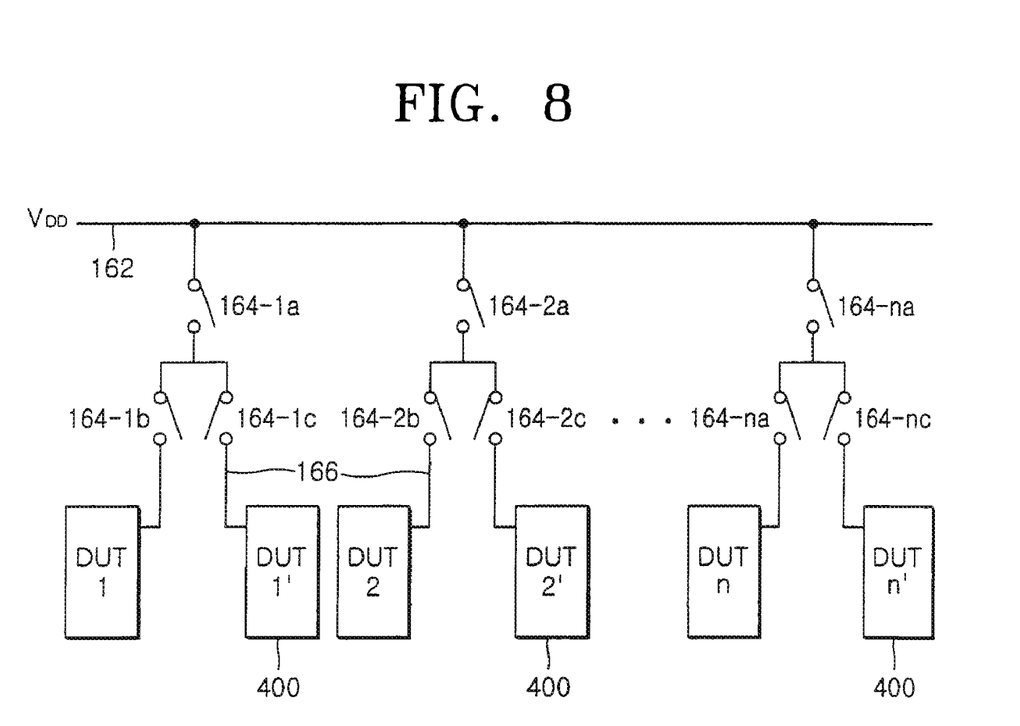
FIG. 8 illustrates the divided power signal lines connected to switching devices in the performance board.

FIG. 8 illustrates the power signal lines 162 connected to switching devices in the performance board 200. Referring to FIG. 8, to solve the problems mentioned in FIG. 7, switching devices, i.e., a plurality of relays (164-1b, 164-1c, 164-2b, 164-2c ... 164-nb, 164-nc) are additionally connected to the power signal lines 162, respectively. The relays (164-1b, 164-1c, 164-2b, 164-2c ... 164-nb, 164-nc) may be in circuit module forms and may be loaded into the performance board 200. The relays (164-1b, 164-1c, 164-2b, 164-2c ... 164-nb, 164-nc) can be controlled, i.e., turned on or off, by signal lines, such as the driver signal lines and the I/O signal lines, which can be utilized using a command language of a test program in a test head.

For example, in a type of memory tester manufactured by ADVANTEST, when a $V_{IH}$ level signal is applied to an LCON node used as a driver signal line, the relays 164-1b and 164-1c are turned on. When the $V_{IH}$ level signal is applied to a PD1 node used as another driver signal line, the relay 164-1b is turned on while the relay 164-1c is turned off.

Conversely, when a $V_{IL}$ level signal is applied to the PD1 node, the relay 164-1b is turned off while the relay 164-1c is turned on. Thus, even though the power signal line 162 connected to the VSU is divided into two power signal lines 166, the power supply of the power signal lines 166 can be controlled using the described switching devices.

As described above, the relays (164-1b, 164-1c, 164-2b, 164-2c ... 164-nb, 164-nc) can be controlled by applying the $V_{IH}/V_{IL}$ level signal on a driver signal line. Likewise, the relays (164-1b, 164-1c, 164-2b, 164-2c ... 164-nb, 164-nc) may be controlled by applying the $V_{IH}/V_{IL}$ level signal to the I/O signal line.

If it is determined that both of the DUT1 and the DUT1' connected to the power signal lines 166 of the VSU are defective, the tester 100 may turn off the relay 164-1 using its operating system, thereby cutting off power supplied to the DUT 1 and the DUT1'.

Figure 9:
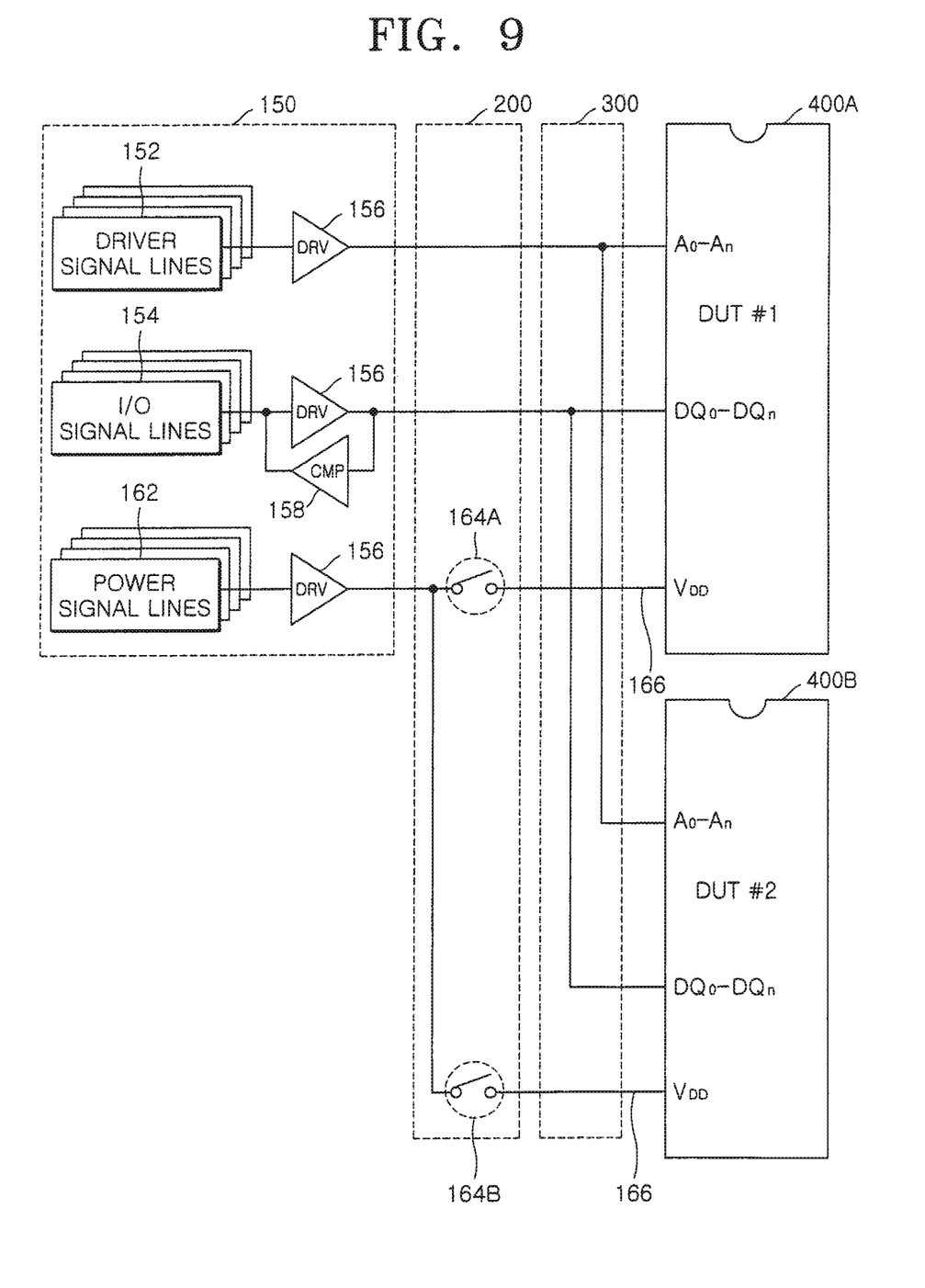
FIG. 9 is a block diagram of a test system including signal lines connected from a test head to first and second DUTs having an increased testing capacity in a parallel test.

FIG. 9 is a block diagram of a test system including the power signal lines 166 connected from the test head 150 to first and second groups of DUTs 400A and 400B having two times the testing capacity in the parallel test. Referring to FIG. 9, the power signal line 162 in the performance board 200 is divided into two power signal lines 166 and relays 164A and 164B are additionally connected to the two power signal lines 166. A driver signal line 152 and an I/O signal line 154 in the interface board 300 are also divided into two driver signal lines and two I/O signal lines, respectively. The two driver signal lines and the two I/O signal lines are respectively connected to the first and second groups of DUTs 400A and 400B, via the performance board 200 and an interface board 300. Therefore, the tester 100 can electrically test the first and second groups of DUTs 400A and 400B simultaneously, which is twice the original testing capacity of the tester 100 in the parallel test.

Figure 10:
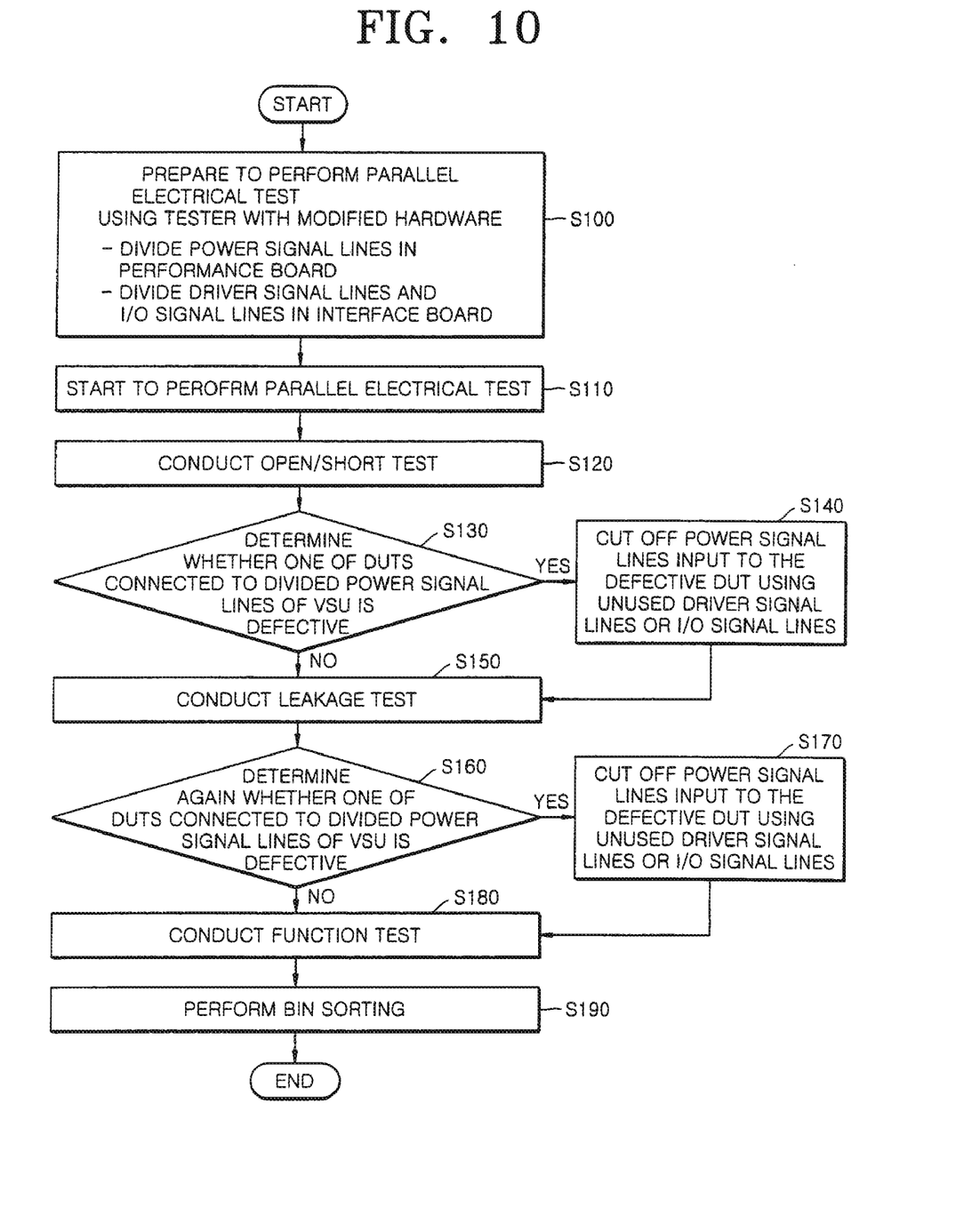
FIG. 10 is a flowchart illustrating a method of performing parallel tests on semiconductor devices.

FIG. 10 is a flowchart illustrating a method of performing parallel tests on semiconductor devices. Referring to FIG. 10, the test system including modified hardware as described above is prepared (S100). The hardware may be modified by dividing the power signal line 162 connected to the VSU in the performance board 200 into two power signal lines 166 and installing a circuit module including a relay in each of the two power signal lines 166. In addition, the hardware may be modified by dividing the driver signal line in the interface board into two driver signal lines or the I/O signal line into two I/O signal lines.

The modified test system starts to electrically test semiconductor devices in a parallel method (S110). In the EDS test conducted when DUTs are in wafer, after the probe card is connected to the performance board 200, the automatic test robot electrically tests doubled DUTs, using the prober system. In the final test conducted when the DUTs are assembled into a semiconductor package, after a DUT board is connected to the performance board 200, the doubled DUTs are electrically tested using the handler as the automatic test robot. The electrical test is initiated by running a test program in the workstation of the tester 100.

The number of DUTs that the tester 100 can test at a time is determined by the number of driver channels, I/O channels, and VSUs in the tester 100 when a tester manufacturer designs the test equipment. However, as described above, the numbers of driver signal lines, I/O signal lines, and power signal lines are increased by modifying the performance board 200 and the interface board 300. Hence, the tester 100 can electrically test DUTs more DUTs than the number of DUTs determined by the tester manufacturer.

An open/short test is conducted in a test program (S120). In the test program, it is evaluated whether the DUTs 400 connected to the two power signal lines 166 are defective (S130). If it is identified that one of the DUTs 400 is defective, the tester 100 forces signals such as $V_{IH}/V_{IL}$ level signals on a driver signal line or an I/O signal line currently unused by the tester 100 running the test program. In this way, the tester 100 controls the relays installed in the two power signal lines 166 to cut off one of the two power signal lines 166, which is input to the defective DUT 400 (S140). The driver signal line and the I/O signal line used to control the relays installed in the two power signal lines 166 may be used for test items included in the parallel test as well as for controlling the relays while the relays are open during the parallel test.

If it is determined that none of the DUTs 400 is defective as a result of the open/short test, a leakage test is conducted (S150). After the leakage test is completed, it is determined again whether the DUTs 400 connected to the two power signal lines 166 are defective (S160). If it is determined that one of the DUTs 400 is defective, the tester 100 applies signals such as $V_{IH}/V_{IL}$ level signals on a driver signal line or an I/O signal line currently unused by the tester 100 running the test program. In this way, the tester 100 controls the relays installed in the two power signal lines 166 to cut off one of the two power signal lines 166, which is input to the defective DUT 400 (S170). By controlling the relays the power signal lines 166 may be cut off once the entire test program is finished or whenever a test item is finished.

If it is determined that none of the DUTs 400 is defective as a result of the leakage test (S150), a function test (S180) and bin sorting (S190) routines may be performed. Then, the parallel electrical test is terminated.

As described above, first, in a parallel test, the number of DUTs can be increased by dividing a power signal line in a performance board of a tester and more efficiently operating the divided power signal lines. Second, if one of DUTs connected to the divided power signal lines is defective, one of the power signal lines, which is input to the defective DUT, may be cut off by controlling a corresponding switching device. Thus, damage to DUTs adjacent to the defective DUT or a probe card may be prevented.

While the invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of performing a parallel test, the method comprising:
   testing a plurality of sets of semiconductor devices in parallel, each set including at least two semiconductor devices;
   determining if at least one of the semiconductor devices of a set is defective as a result of the testing of the sets of semiconductor devices; and
   disconnecting the set with at least one defective semiconductor device from at least one power signal line.

2. The method of claim 1, wherein disconnecting the set further comprises using a switching device to disconnect the set from the at least one power signal line, the switching device including a circuit module including a relay.

3. The method of claim 1, disconnecting the set further comprising disconnecting the set in response to a signal on a signal line of a performance board.

4. The method of claim 3, wherein the signal line is one selected from the group consisting of a driver signal line and an input/output signal line.

5. The method of claim 4, disconnecting the set further comprising disconnecting the set in direct response to the signal on the signal line of the performance board.

6. The method of claim 1, wherein disconnecting the set further comprises disconnecting the set with at least one defective semiconductor device even if other semiconductor devices in the set are not determined to be defective.

7. The method of claim 1, wherein each set of semiconductor devices is a set of discrete semiconductor devices, each set including a plurality of discrete semiconductor devices.

* * * * *